(12) United States Patent
Korony (10) Patent No.: US 10,476,465 B2
(45) Date of Patent: *Nov. 12, 2019

(54) PARALLEL RC CIRCUIT EQUALIZERS

(71) Applicant: AVX Corporation, Fountain Inn, SC (US)

(72) Inventor: Gheorghe Korony, Myrtle Beach, SC (US)

(73) Assignee: AVX Corporation, Fountain Inn, SC (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/864,176

(22) Filed: Jan. 8, 2018

(65) Prior Publication Data

US 2018/0198432 A1 Jul. 12, 2018

Related U.S. Application Data

(63) Continuation of application No. 15/093,861, filed on Apr. 8, 2016, now Pat. No. 9,866,193.

(60) Provisional application No. 62/149,968, filed on Apr. 20, 2015.

(51) Int. Cl.
*H03H 1/02* (2006.01)
*H03H 7/06* (2006.01)
*H04B 3/04* (2006.01)

(52) U.S. Cl.
CPC ............... *H03H 7/06* (2013.01); *H03H 1/02* (2013.01); *H04B 3/04* (2013.01)

(58) Field of Classification Search
CPC .. H03H 7/06; H03H 1/02; H01P 5/087; H04B 3/04; H04B 3/14; H04B 3/144; H04B 3/143
See application file for complete search history.

(56) References Cited

U.S. PATENT DOCUMENTS

| | | |
|---|---|---|
| 5,889,445 A | 3/1999 | Ritter et al. |
| 6,285,542 B1 | 9/2001 | Kennedy, III et al. |
| 6,525,628 B1 | 2/2003 | Ritter et al. |
| 6,898,070 B2 | 5/2005 | Korony et al. |
| 7,005,722 B2 | 2/2006 | Schaper et al. |

(Continued)

OTHER PUBLICATIONS

J. Andresakis et al., 1645861 Novel Substrate With Combined Embedded Capacitance and Resistance for Better Electrical Performance and Higher Integration (published Abstract), In Proceeding of Electronic Components and Technology Conference, 2006.

(Continued)

*Primary Examiner* — Stephen E. Jones
(74) *Attorney, Agent, or Firm* — Dority & Manning, P.A.

(57) ABSTRACT

Disclosed are apparatus and methodology for increasing the resonance frequency and useful frequency range of surface mount RC equalizer devices. The presently disclosed subject matter provides improved operational characteristics of generally known such RC equalizer devices by implementing a reverse geometry that relocates the internal termination points, as well as external termination points for such devices, along lateral portions of the assembled device. Such reverse geometry achieves improvements by providing a reduction of the equivalent series inductance (ESL) to provide the increased resonance frequency and useful frequency range.

28 Claims, 6 Drawing Sheets

(56) References Cited

U.S. PATENT DOCUMENTS

| | | |
|---|---|---|
| 10,033,346 B2 * | 7/2018 | Korony .................. H03H 1/02 |
| 2006/0232356 A1 | 10/2006 | Roldan et al. |
| 2010/0117768 A1 | 5/2010 | Chuang et al. |
| 2011/0069463 A1 | 3/2011 | Chen |
| 2015/0116055 A1 | 4/2015 | Park et al. |
| 2015/0171920 A1 | 6/2015 | Kameya |

OTHER PUBLICATIONS

Sun et al., RC Passive Equalizer for Through Silicon Via (published Abstract), Electrical Performance of Electronic Packaging and Systems, (EPEPS), 2010 IEEE 19th Conference Oct. 2010.

* cited by examiner

PARALLEL RC CIRCUIT EQUALIZERS

CROSS REFERENCE TO RELATED APPLICATIONS

The present application is a continuation of U.S. application Ser. No. 15/093,861, filed on Apr. 8, 2016, which claims benefit of U.S. Provisional Application Ser. No. 62/149,968 having a filing date of Apr. 20, 2015, which are incorporated herein in their entirety by reference thereto.

FIELD OF THE SUBJECT MATTER

The presently disclosed subject matter relates to surface mountable glass sandwich flex-terminated RC circuits. In particular, the presently disclosed subject matter relates to improvements in such surface mount devices that provides for reduction of the equivalent series inductance (ESL) to provide increased resonance frequency and useful frequency range. When used in an optical device, that allows the equalizer to better attenuate lower frequencies and accentuate higher frequencies in order to compensate for frequency dependence.

BACKGROUND OF THE SUBJECT MATTER

Circuit equalizers may be used in various forms including as compensation for signal losses and/or degradation over conductors on printed circuit assemblies among other applications. Such devices operate by passively adjusting the impedance characteristic of the signal pathway and have applicability in a broad range of applications including optical transceiver modules, broadband receivers, Transmit Optical Sub-Assemblies (TOSA), Receive Optical Sub-Assemblies (ROSA), and various other high frequency devices.

Known surface mountable RC equalizer circuits have addressed issues including resonant frequency and useful frequency range but have not provided a device that meets current desirable operational requirements. It would be advantageous, therefore, if a device could be provided that provided both increased resonance frequency and useful frequency range.

SUMMARY OF THE SUBJECT MATTER

In view of the recognized features encountered in the prior art and addressed by the presently disclosed subject matter, improved apparatuses and methodologies have been developed that provide for reducing equivalent series inductance (ESL) in a surface mountable RC equalizer circuit to thereby permit increasing resonance frequency with a larger useful frequency range.

In accordance with one aspect of an exemplary embodiment of the presently disclosed subject matter, a parallel connected RC circuit has been provided wherein termination points are configured to provide reduced ESL for the RC devices. In some embodiments of the presently disclosed subject matter, such reduced ESL is provided by selective placement of termination material along an extended portion of the assembled device.

In accordance with another aspect of an exemplary embodiment of the presently disclosed subject matter, a parallel RC equalizer circuit may be configured based on the structure of a coplanar waveguide. In some such embodiments, reduced ESL may be provided by inclusion of a centrally located and extended ground termination. In such embodiments, the ground termination may correspond to a termination centrally located between longitudinal placed ports on the device.

In accordance with additional aspects of some embodiments of the presently disclosed subject matter, methodologies have been developed for reducing ESL in a parallel RC circuit device wherein selective placement of termination material and internal connections to such termination material produce the desired reduction in ESL and consequently provide for improvements in both resonance frequency and useful frequency range.

One exemplary embodiment of the presently disclosed subject matter relates to a parallel RC circuit equalizer having relatively increased resonance frequency and useful frequency range. Such exemplary equalizer preferably comprises a monolithic substrate, a capacitor, first and second terminal layers, a resistor, and at least one connection terminal associated with such resistor. Such exemplary arrangement of such terminal layers and such at least one connection terminal results in reduced equivalent series inductance of such capacitor, which relatively increases the resonance frequency and useful frequency range of the resistor and capacitor combined circuit.

In the foregoing exemplary embodiment, preferably such monolithic substrate has at least a top surface and at least one pair of opposing lateral edges along such top surface of such substrate; such capacitor has a first electrode layer and a second electrode layer, with both electrode layers mounted on such top surface of such substrate, and separated by a dielectric; such first terminal layer is connected to such first electrode layer and positioned on such top surface of such substrate and along at least a portion of one of such lateral edges thereof; such second terminal layer is connected to such second electrode layer and positioned on such top surface of such substrate and along at least a portion of such lateral edge thereof opposite to such first terminal layer; and such resistor is supported on such substrate top surface and connected in parallel with such capacitor.

In variations of the foregoing, a cover may be included above such substrate; and a pair of terminations may be provided on either lateral side of such substrate, and respectively connected with such first and second terminal layers, whereby such equalizer is surface mountable by direct mounting of such terminations on a supporting surface. In further variations, such cover may comprise a glass cover, and such terminations may comprise flexible terminations.

In still other variations, such flexible terminations may comprise flexible polymer material that encases end portions of such capacitor. In some variations thereof, one of such flexible terminations may couple such first terminal layer connected to such first electrode layer of such capacitor with such at least one connection terminal associated with such resistor. In others, one of such flexible terminations may couple with such second terminal layer connected to such second electrode layer of such capacitor.

In yet other alternative arrangements of the foregoing exemplary equalizer embodiment, such capacitor may comprise a silicon oxynitride (SiON) capacitor or a tantalum capacitor; and such resistor may comprise a tantalum nitride (TaN) resistor or a ruthenium oxide resistor. In some exemplary embodiments of the foregoing, such equalizer may have an impedance of about 50 $\Omega$ between such pair of terminations on either lateral side of such substrate.

In other variations, such an exemplary equalizer may further include a glass cover above such substrate; and a pair of flexible terminations on either lateral side of such substrate, and respectively connected with such first and second terminal layers so that such equalizer is surface mountable; with such flexible terminations comprising flexible polymer material that encases end portions of such capacitor; with one of such flexible terminations coupling such first terminal layer connected to such first electrode layer of such capacitor with such at least one connection terminal associated with such resistor; and the other of such flexible terminations coupling with such second terminal layer connected to such second electrode layer of such capacitor.

In yet another presently disclosed exemplary embodiment, a parallel RC circuit equalizer preferably has relatively increased resonance frequency and useful frequency range. Such equalizer preferably comprises a monolithic substrate having at least a top surface and at least one pair of opposing lateral edges along such top surface of such substrate, such substrate being elongated along such opposing lateral edges thereof and having respective opposite end edges; a capacitor mounted on such top surface of such substrate; a resistor supported on such substrate top surface and connected in parallel with such capacitor; a pair of respective waveguide elements connected with the ground, and supported on such top surface of such substrate so as to extend respectively to such respective opposite end edges of such substrate; and a pair of ground electrodes positioned on such top surface of such substrate and respectively extending along at least a portion of such opposing lateral edges of such top surface of such substrate. Such arrangement of such elements and such electrodes preferably results in reduced equivalent series inductance of such capacitor, which relatively increases the resonance frequency and useful frequency range of the resistor and capacitor combined circuit.

In alternatives of the foregoing exemplary embodiment, such equalizer may further include a cover above such substrate; and a pair of end terminations on either end of such substrate. Such end terminations are preferably respectively connected with such pair of respective waveguide elements, whereby such equalizer is surface mountable by direct mounting of such terminations on a supporting surface. Other variations may further include a ground termination centrally received about at least a portion of such substrate and connecting with such pair of ground electrodes.

Still further, in some instances such cover may comprise a glass cover; and such pair of end terminations and such ground termination may comprise flexible terminations. In other instances, such flexible terminations may comprise flexible polymer material. In some of the foregoing variations, such capacitor may comprise a silicon oxynitride (SiON) capacitor or a tantalum capacitor; and such resistor may comprise a tantalum nitride (TaN) resistor or a ruthenium oxide resistor.

In some exemplary embodiments of the foregoing, such equalizer may have an impedance of about 50Ω between such pair of end terminations.

It is to be understood from the complete disclosure herewith that the presently disclosed subject matter equally pertains to corresponding and/or associated methodology. One exemplary embodiment of methodology for relatively increasing the resonance frequency and useful frequency range of a parallel RC circuit equalizer, may preferably comprise providing a monolithic substrate having at least a top surface and at least one pair of opposing lateral edges along such top surface of such substrate, such substrate being elongated along such opposing lateral edges thereof and having respective opposite end edges; supporting a capacitor on such top surface of such substrate; supporting a resistor on such substrate top surface and connected in parallel with such capacitor so as to form an RC circuit therewith; and providing termination material positioned on such top surface of such substrate and along at least a portion of each of such opposing lateral edges thereof, resulting in reduced equivalent series inductance of such capacitor, which relatively increases the resonance frequency and useful frequency range of the resistor and capacitor combined circuit.

Some variations of the foregoing methodology may further include providing at least a pair of coplanar waveguide elements supported on such substrate and aligned lengthwise along a center line of such substrate, with such waveguide elements received in series and on either side of such RC circuit and extending from such RC circuit to the respective opposite end edges of such substrate. In come such variations, such providing termination material may include providing a pair of ground electrodes positioned respectively along such lateral edges of such substrate. Yet others may further include providing a cover above such substrate; and providing a pair of flexible terminations received at respective opposite end edges of such substrate, and respectively connected with such waveguide elements at such opposite end edges.

Still further variations may also include providing a ground terminal received at least partly around such substrate and connected with such pair of ground electrodes. In some such alternatives, such flexible terminations may comprise flexible polymer material; such capacitor may comprise one of a silicon oxynitride (SiON) capacitor and a tantalum capacitor; and such resistor may comprise one of a tantalum nitride (TaN) resistor and a ruthenium oxide resistor.

For some alternatives, presently disclosed methodology may further include surface mounting such equalizer on a supporting surface.

In other presently disclosed variations, such capacitor may have a first electrode layer and a second electrode layer, with both of such electrode layers mounted on such top surface of such substrate, and separated by a dielectric; and such termination material may include a first terminal layer connected to such first electrode layer and positioned on such top surface of such substrate and along at least a portion of one of such lateral edges thereof, and a second terminal layer connected to such second electrode layer and positioned on such top surface of such substrate and along at least a portion of such lateral edge thereof opposite to such first terminal layer.

Still other variations may further include providing at least one connection terminal associated with such resistor; and providing a cover above such substrate, and a pair of terminations on either lateral side of such substrate, and respectively connected with such first and second terminal layers.

Also, other variations may further include a glass cover above such substrate; and a pair of flexible terminations on either lateral side of such substrate, and respectively connected with such first and second terminal layers so that such equalizer is surface mountable; and with such flexible terminations comprising flexible polymer material that encases end portions of such capacitor; with one of such flexible terminations coupling such first terminal layer connected to such first electrode layer of such capacitor with such at least one connection terminal associated with such resistor; and with the other of such flexible terminations coupling with such second terminal layer connected to such second electrode layer of such capacitor.

Additional embodiments of the presently disclosed subject matter are set forth in, or will be apparent to, those of ordinary skill in the art from the detailed description herein. Also, it should be further appreciated that modifications and variations to the specifically illustrated, referred and discussed features and elements hereof may be practiced in various embodiments and uses of the subject matter without departing from the spirit and scope of the subject matter. Variations may include, but are not limited to, substitution of equivalent means, features, or steps for those illustrated, referenced, or discussed, and the functional, operational, or positional reversal of various parts, features, steps, or the like.

Still further, it is to be understood that different embodiments, as well as different presently preferred embodiments, of the presently disclosed subject matter may include various combinations or configurations of presently disclosed features, steps, or elements, or their equivalents (including combinations of features, parts, or steps or configurations thereof not expressly shown in the figures or stated in the detailed description of such figures). Additional embodiments of the presently disclosed subject matter, not necessarily expressed in the summarized section, may include and incorporate various combinations of aspects of features, components, or steps referenced in the summarized objects above, and/or other features, components, or steps as otherwise discussed in this application. Those of ordinary skill in the art will better appreciate the features and aspects of such embodiments, and others, upon review of the remainder of the specification.

BRIEF DESCRIPTION OF THE DRAWINGS

A full and enabling disclosure of the presently disclosed subject matter, including the best mode thereof, directed to one of ordinary skill in the art, is set forth in the specification, which makes reference to the appended figures, in which.

Repeat use of reference characters throughout the present specification and appended drawings is intended to represent same or analogous features or elements.

DETAILED DESCRIPTION OF THE SUBJECT MATTER

As discussed in the Summary of the Subject Matter section, the presently disclosed subject matter is particularly concerned with improvements to surface mount parallel connected RC devices that provides for reduction of the equivalent series inductance (ESL) to provide increased resonance frequency and useful frequency range.

Selected combinations of aspects of the disclosed technology correspond to a plurality of different embodiments of the presently disclosed subject matter. It should be noted that each of the exemplary embodiments presented and discussed herein should not insinuate limitations of the presently disclosed subject matter. Features or steps illustrated or described as part of one embodiment may be used in combination with aspects of another embodiment to yield yet further embodiments. Additionally, certain features may be interchanged with similar devices or features not expressly mentioned which perform the same or similar function.

Reference is made hereafter in detail to exemplary presently preferred embodiments of the subject parallel RC circuit equalizer. Referring to the drawings, FIGS. 1-4 illustrate a previously known parallel RC circuit equalizer 100, 200 (FIGS. 1-2) together with operational characteristic curves 300 (FIG. 3) and related equivalent circuit 400 therefor (FIG. 4). As may be seen in FIG. 1, RC circuit equalizer 100 corresponds to a glass substrate 102 on which are mounted a capacitor 104 and resistor 106.

Figure 1:
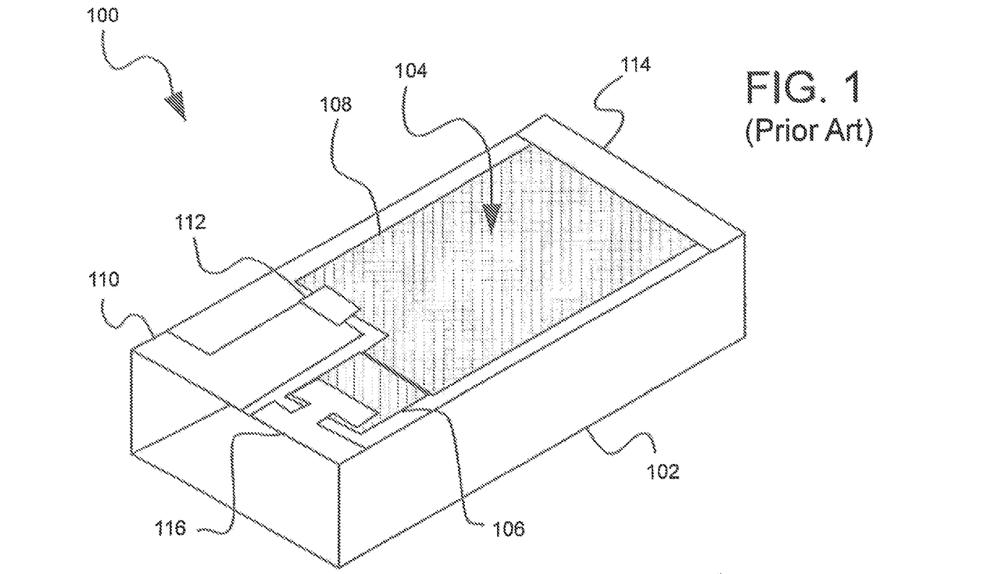
FIG. 1 illustrates the internal configuration of a previously known resistor and parallel connected capacitor (RC) construction.

In accordance with such known device, capacitor 104 may correspond to a silicon oxynitride (SiON) capacitor having a first electrode 108 thereof coupled to a conductive trace 110 on substrate 102 via conductor 112. As will be understood by those of ordinary skill in the art, capacitor 106 also includes a second electrode (not seen) below first electrode 108 and separated therefrom via a SiON layer (also not seen). Such second electrode (unseen in this view) is coupled to one end of resistor 106 and to connection terminal 114. Resistor 106 is further coupled at a second end thereof to connection terminal 116.

Figure 2:
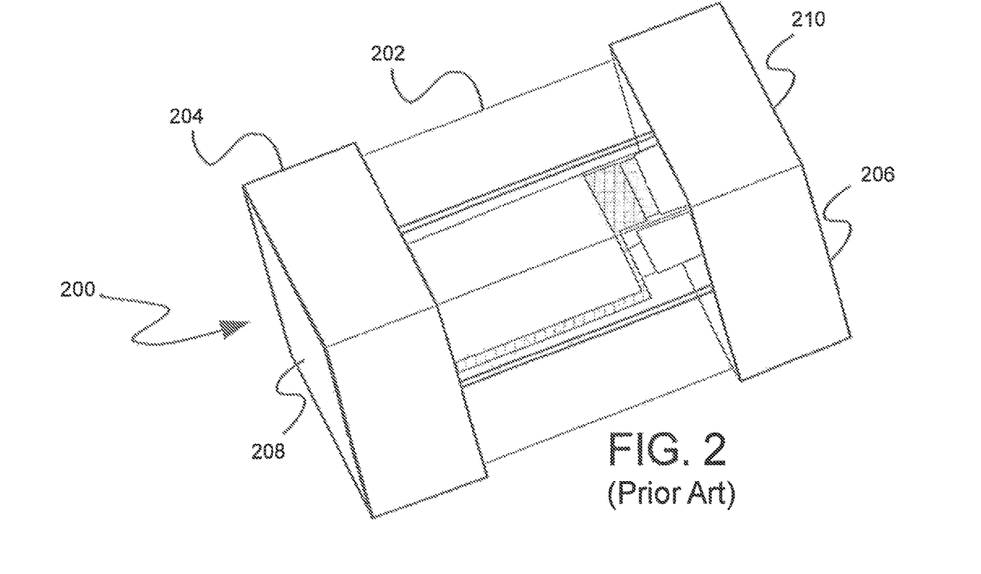
FIG. 2 illustrates the parallel RC device of FIG. 1 with glass cover and flexible terminations.

With reference to FIG. 2, there is illustrated the parallel RC device 200 of FIG. 1 with glass cover and flexible terminations 202, 204 added. Flexible terminations 202, 204 may correspond to a flexible polymer material that encases the end portions 208, 210 of capacitor 200 and couples terminals 110, 116 together and provides an external connection point for connection terminal 114.

Figure 3:
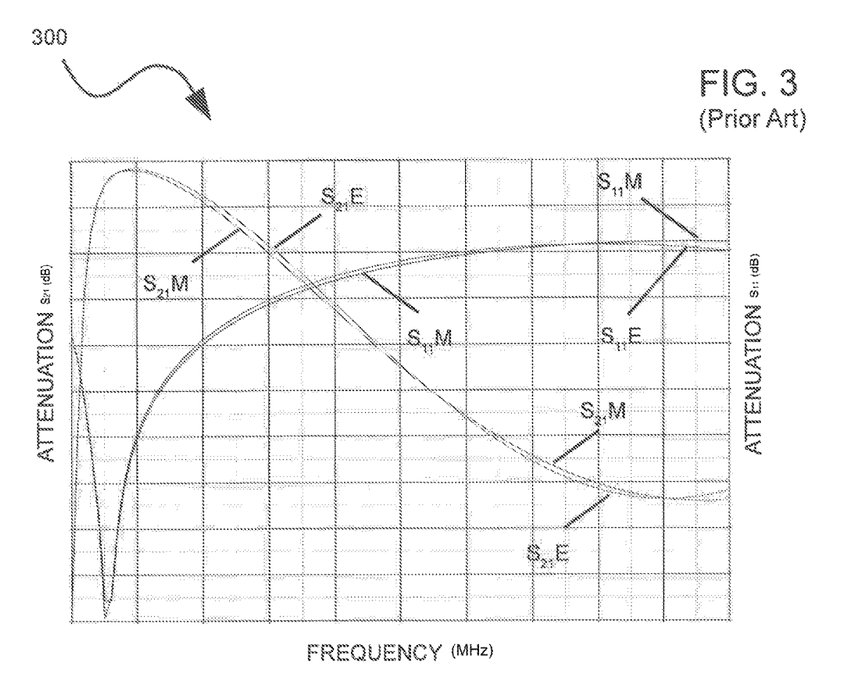
FIG. 3 illustrates graphic response curves related to the previously known device illustrated in FIGS. 1 and 2.
Figure 4:
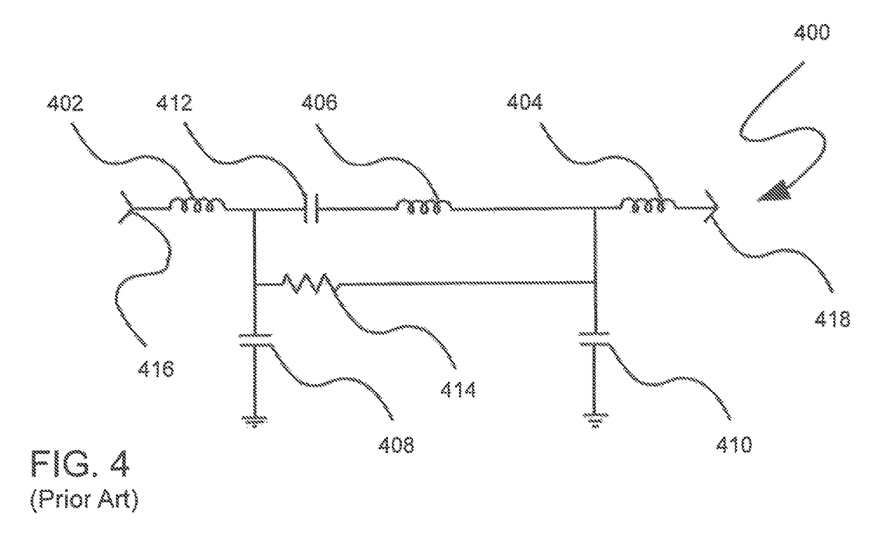
FIG. 4 illustrates an equivalent circuit diagram for the previously known device illustrated in FIGS. 1 and 2.

With reference to FIG. 3, there are illustrated graphic response curves 300 related to the device illustrated in FIGS. 1 and 2. Those of ordinary skill in the art will appreciate that the notations $S_{11}$ and $S_{21}$ represent reflection and forward transmission coefficients, respectively, for the RC circuit. From an inspection of FIG. 3, it will be noticed that the forward transmission coefficient for a simulated model, $S_{21}M$, and for that of the equivalent circuit illustrated in FIG. 4, $S_{21}E$, track with minimum variations. Similarly, the reflection coefficients for a simulated model, $S_{11}M$, and that of the equivalent circuit, $S_{11}E$, also track with only minor variations.

As understood by those of ordinary skill in the art, the values of S11 and S21 are plotted, as illustrated in FIG. 3, in terms of frequency versus attenuation or gain. An inspection of FIG. 3 shows that the resonance frequency for the device illustrated in FIGS. 1 and 2 is quite low on the frequency scale while the usable frequency range begins to drop off rapidly above resonance. As an example, the frequency scale of this example corresponds to 100-30,000 MHZ so that the resonance point is below about 3,000 MHz.

With reference to FIG. 4, there is illustrated an equivalent circuit diagram for the device illustrated in FIGS. 1 and 2. As noted above and illustrated in FIG. 3, the response curves for the equivalent circuit well track a simulation of the circuit. In one example, the values for inductors 402 and 404 were equivalent and corresponded to 0.287 nH. Similarly the values for capacitors 408 and 410 were equal and corresponded to 0.062 pF. Inductor 406 had a value of 0.071 nH while capacitor 412 had a value of 17.684 pF and resistor 414 had a value 22.084Ω. Such values produced a characteristic impedance ($Z_0$) of 50Ω at both the input port 416 and output port 418.

Figure 5:
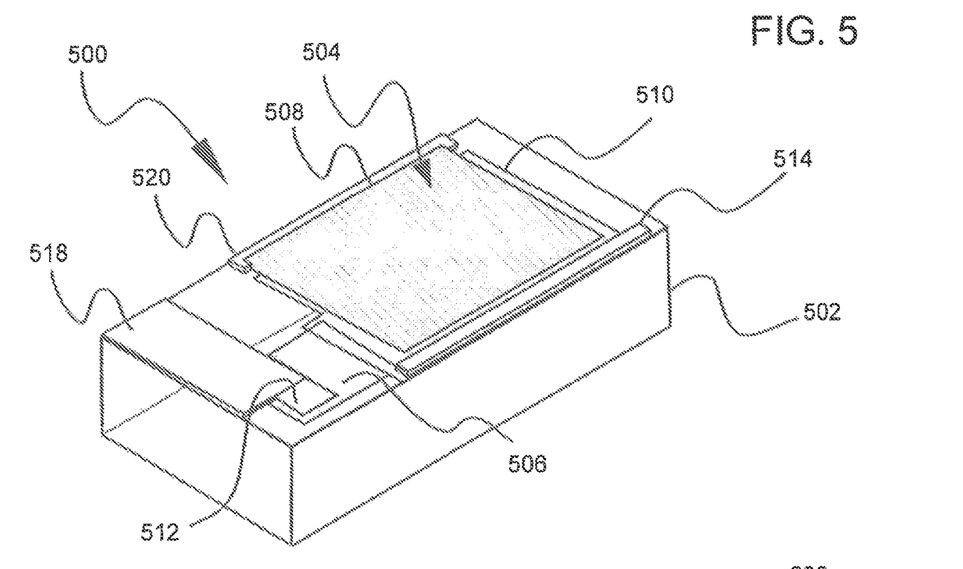
FIG. 5 illustrates an exemplary embodiment of internal configuration of a resistor and parallel connected capacitor in accordance with the presently disclosed subject matter.

With reference to FIG. 5, the internal configuration of a resistor 506 and parallel connected capacitor 504 of an RC circuit equalizer 500 in accordance with the presently disclosed subject matter is illustrated. From a comparison with the device illustrated in FIG. 1 and that of FIG. 5 constructed in accordance with the presently disclosed subject matter, it will be noticed that the internal components have some similarities but with the exception of the arrangement of the connection terminals 520, 514, 512, 518. In accordance with the presently disclosed subject matter, RC equalizer 500 is arranged in a transverse geometry from that illustrated in FIG. 1. As is further described herein, such rearrangement provides reduced ESL of capacitor 504, thereby increasing the resonance frequency of the RC parallel circuit as well as the circuit's useful frequency range.

In some exemplary embodiments of the presently disclosed subject matter, capacitor 504 may be provided as a silicon oxynitride (SiON) capacitor while resistor 506 may correspond to a tantalum nitride (TaN) resistor. Those of ordinary skill in the art should appreciate, however, that both capacitor 504 and resistor 506 may be provided using any suitable materials and configurations. For example, tantalum capacitors and/or ruthenium oxide resistors might be used.

With continued reference to FIG. 5, it will be noticed that capacitor 504 in some ways is constructed in similar manner to capacitor 104 of FIG. 1 in that there is provided a first electrode layer 508 separated by a dielectric (not seen in this view) from a second electrode layer 510 both mounted on the top surface of a glass substrate 502. First electrode layer 508 is provided with a terminal layer 520 that is positioned on the top surface and along a portion of the lateral edge of substrate 502. Similarly, a second electrode 510 is provided with a terminal layer 514 in contact with second electrode layer 510 and positioned along the lateral edge of the top surface of substrate 502 opposite to terminal layer 520.

Figure 6:
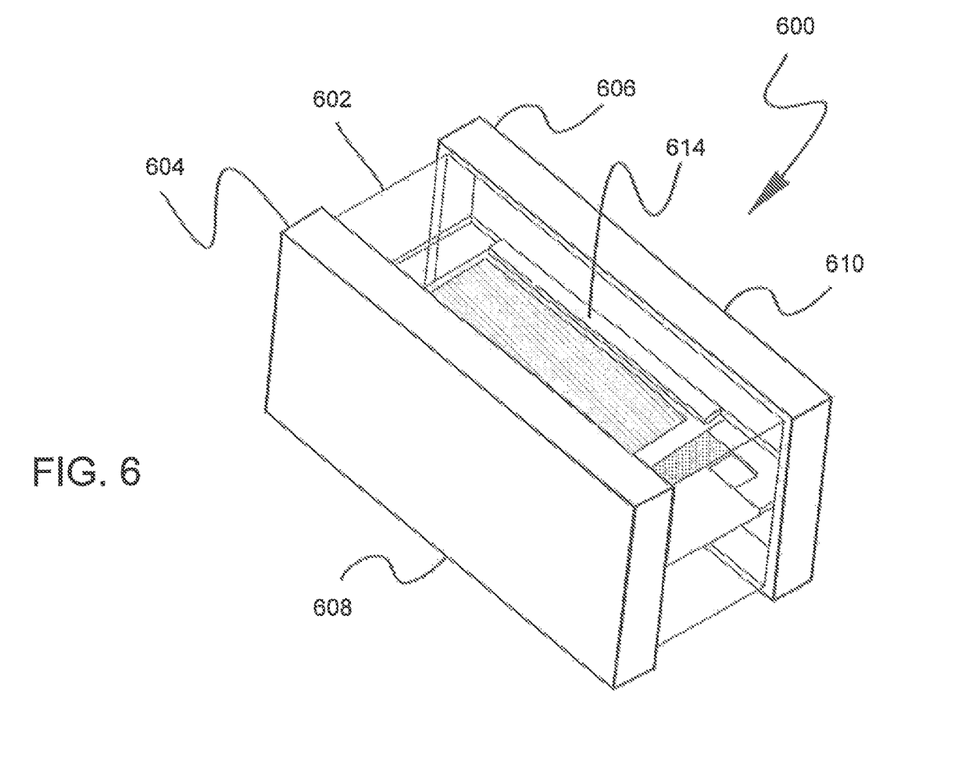
FIG. 6 illustrates an exemplary parallel RC device constructed in accordance with FIG. 5 with glass cover and flexible terminations in accordance with the presently disclosed subject matter.

With reference to FIG. 6, there is illustrated a parallel RC device 600 (device 500 of FIG. 5) with glass cover 602 and flexible terminations 604, 606 added. Flexible terminations 604, 606 may correspond to a flexible polymer material that encases the end portions 608, 610 of the capacitor and couples terminals 518, 520 (FIG. 5) together and provides an external connection point for connection terminal 614, respectively. It should be appreciated that while the use of flexible termination material has been illustrated, other known termination materials may be used as well.

Figure 7:
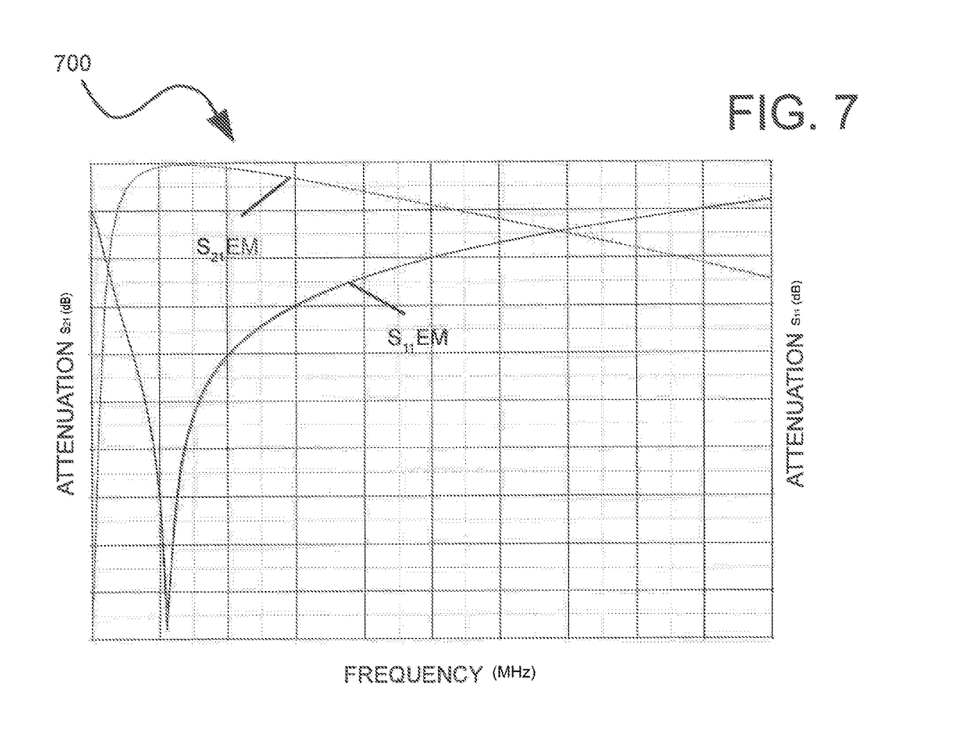
FIG. 7 illustrates graphic response curves related to the device illustrated in FIGS. 5 and 6.

With reference to FIG. 7, there are illustrated graphic response curves 700 related to the exemplary device illustrated in FIGS. 5 and 6. From an inspection of FIG. 7, it will be noticed that the forward transmission coefficient $S_{21}M$ for a simulated model and for that of the equivalent circuit $S_{21}E$ illustrated in FIG. 8, track exactly and are thus illustrated as a single line $S_{21}EM$. Similarly, the reflection coefficients $S_{11}M$ for a simulated model and that of the equivalent circuit $S_{11}E$ also track exactly and are illustrated as single line $S_{11}EM$.

An inspection of FIG. 7 shows that the resonance frequency for the device illustrated in FIGS. 5 and 6 is higher on the frequency scale than that illustrated in the curves 300 of FIG. 3 while the usable frequency range starts to drop off at a much higher frequency. As with the curves illustrated in FIG. 3, the frequency scale of this example corresponds to 100-30,000 MHZ so that the resonance point is above about 3,000 MHz.

Figure 8:
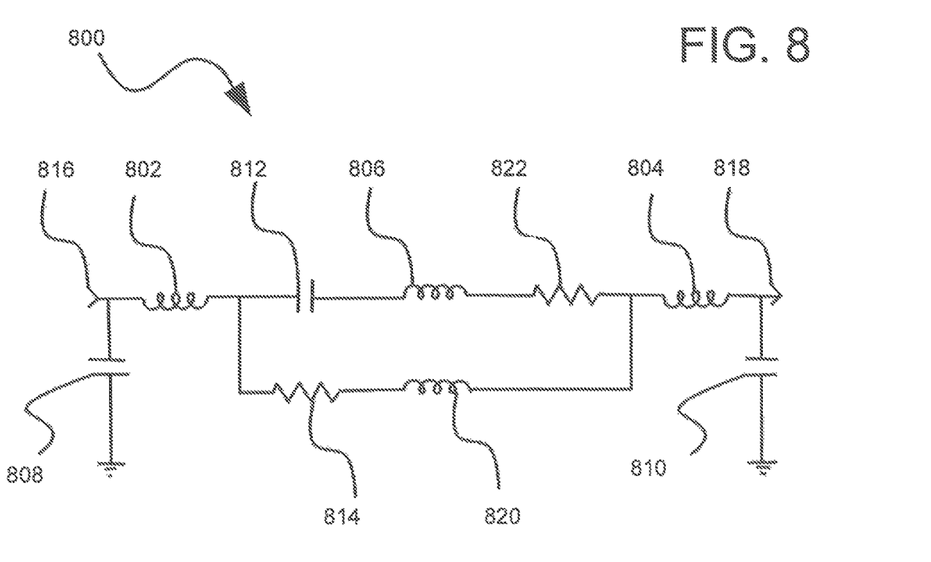
FIG. 8 illustrates an equivalent circuit diagram for the exemplary device illustrated in FIGS. 5 and 6.

With reference to FIG. 8, there is illustrated an equivalent circuit diagram for the exemplary device illustrated in FIGS. 5 and 6. As noted above and as illustrated in FIG. 7, the response curves for the equivalent circuit track the simulation of the circuit exactly. In one example, the values for inductors 802 and 804 were equivalent and corresponded to 0.091 nH. Similarly the values for capacitors 808 and 810 were equal and corresponded to 0.028 pF. Inductor 806 had a value of 0.075 nH while capacitor 812 had a value of 18.019 pF and resistor 814 had a value 22.769Ω. In such equivalent circuit, inductor 806 had a value of 0.075 nH while inductor 820 had a value of 0.11 nH. Resistor 822 had a value of 0.07Ω. As was obtained also in the equivalent circuit of FIG. 4, the equivalent circuit if FIG. 7 produced a characteristic impedance ($Z_0$) of 50Ω at both the input port 816 and output port 818.

Figure 9:
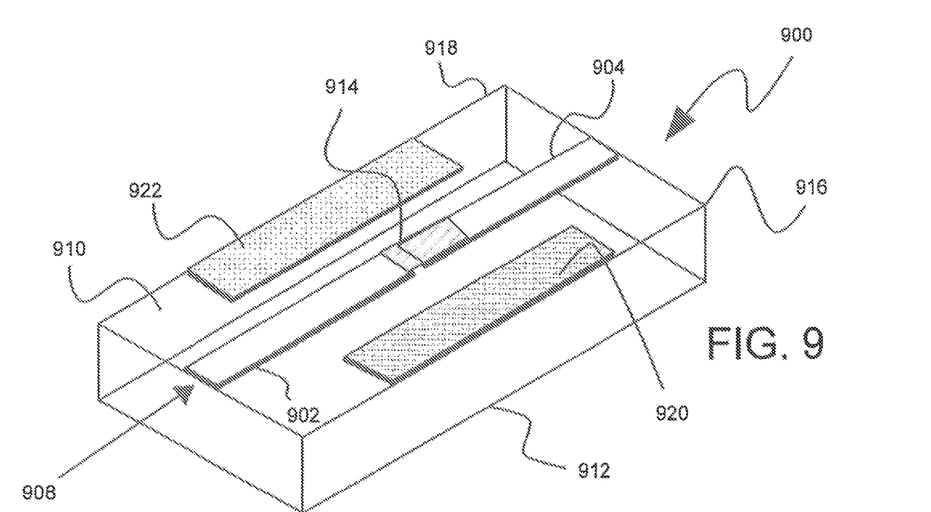
FIG. 9 illustrates an exemplary embodiment of a parallel RC device constructed in accordance with an alternative embodiment of the presently disclosed subject matter.

With reference to FIG. 9, there is illustrated a parallel RC device 900 constructed in accordance with an alternative embodiment of the presently disclosed subject matter. More specifically, RC device 900 is constructed with an internal structure based on a coplanar waveguide. As illustrated in FIG. 9, the coplanar waveguide structure includes waveguide elements 902, 904 aligned lengthwise along a center line 908 of the upper surface 910 of an elongated glass substrate 912. A resistor-capacitor (RC) structure 914 is provided between the two waveguide elements 902, 904. RC structure 914 is configured to provide a parallel RC circuit coupled in series with the two waveguides 902, 904.

A pair of ground electrodes 920, 922 is positioned along lateral edges 916, 918 of glass substrate 912. Side edges of ground electrodes 920, 922 each extend to the lateral edges of their respective lateral edges 916, 918 of glass substrate 912 to provide connection points for a ground terminal otherwise described herein.

Figure 10:
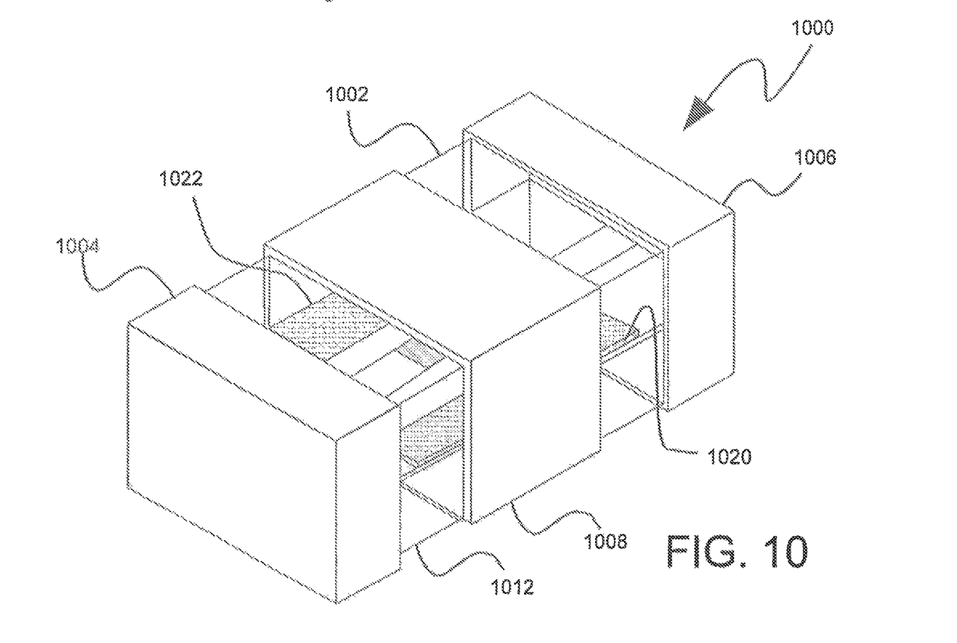
FIG. 10 illustrates an exemplary parallel RC device constructed in accordance with FIG. 9 with glass cover and flexible terminations in accordance with the presently disclosed subject matter.

With reference to FIG. 10, there is illustrated a parallel RC device 1000 constructed in accordance with the device illustrated in FIG. 9 with glass cover 1002 and flexible terminations 1004, 1006, 1008 added in accordance with the presently disclosed subject matter. In an exemplary configuration, glass cover 1002 may be secured to glass substrate 1012 via an epoxy layer (not separately illustrated). In one exemplary embodiment, such epoxy layer may be approximately 10 μm thick. Ground electrodes 1020, 1022 are each arranged such that the lateral edges thereof proximate the lateral edges of glass substrate 1012 are contacted by flexible termination 1008 which functions as a ground terminal for coplanar waveguide RC device 1000.

Further, waveguide elements 902, 904 (FIG. 9) are arranged such that the longitudinal ends thereof proximate the longitudinal ends of glass substrate 1012 are arranged such that they may be contacted by flexible terminations 1004, 1006, respectively. In such manner, flexible terminations 1004, 1006 function as input and output ports, respectively, for RC device 1000.

Figure 11:
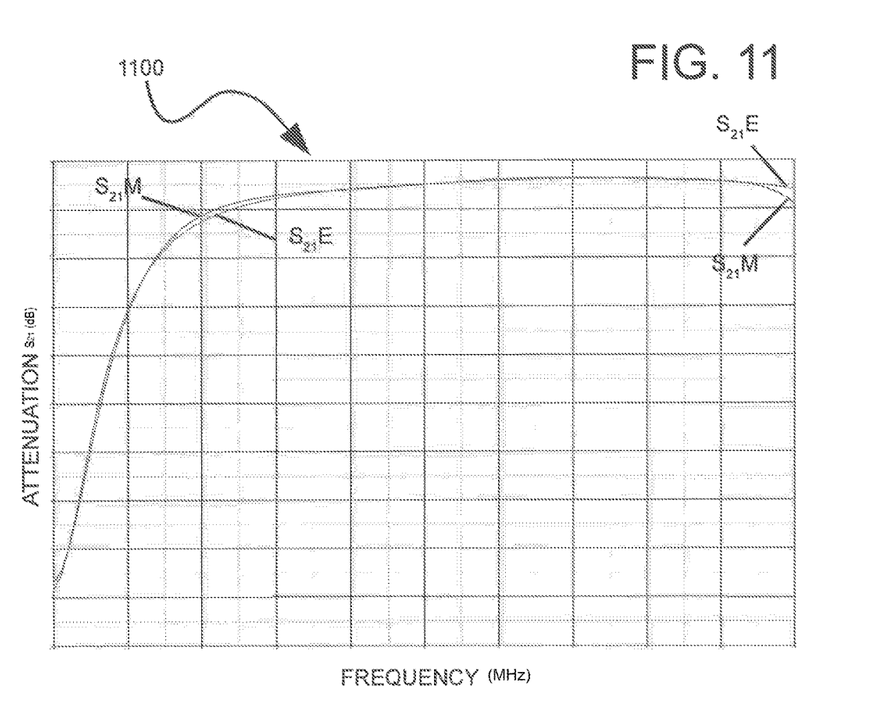
FIG. 11 illustrates graphic response curves related to the exemplary device illustrated in FIGS. 9 and 10.

FIG. 11 illustrates graphic response curves 1100 related to the exemplary alternative embodiment device illustrated in FIGS. 9 and 10. From an inspection of FIG. 11, it will be noted that the $S_{21}$ curves of the modeled device $S_{21}M$ and that of the equivalent circuit $S_{21}E$ illustrated in FIG. 12 track each other almost exactly. Further, it should be appreciated that in such embodiment of the presently disclosed subject matter, the usable frequency range extends somewhat higher than that of the embodiment illustrated in FIGS. 5-8 and significantly higher than that of the previously known device illustrated in FIGS. 1-4.

Figure 12:
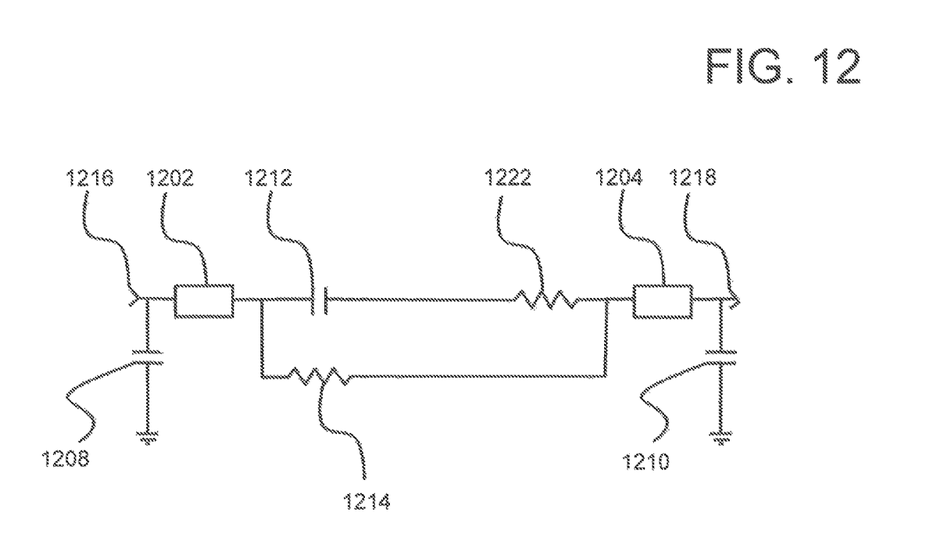
FIG. 12 illustrates an equivalent circuit diagram for the exemplary device illustrated in FIGS. 9 and 10.

With reference to FIG. 12, there is illustrated an equivalent circuit diagram for the exemplary alternative embodiment device illustrated in FIGS. 9 and 10. As noted above and illustrated in FIG. 11, the response curves for the equivalent circuit track each other almost exactly. In one example, the value for transmission line inductor 1202 was 5.371 nH. In such example, transmission line inductor 1204 had a value of 4.918 nH. Similarly, the values for capacitors 1208 and 1210 were equal and corresponded to 0.064 pF. Resistor 1222 had a value of 0.0841Ω and resistor 1214 had a value of 35.719Ω. As was obtained also in the equivalent circuit of FIG. 8, the equivalent circuit of FIG. 12 produced a characteristic impedance ($Z_0$) of 50Ω at both the input port 1216 and output port 1218.

While the presently disclosed subject matter has been described in detail with respect to specific embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the presently disclosed subject matter as would be readily apparent to one of ordinary skill in the art.

What is claimed is:

1. A parallel RC circuit equalizer comprising:
    a monolithic substrate having a first end, a second end, and a length between the first end and second end in a first direction, the monolithic substrate having a width in a second direction that is perpendicular to the first direction, the width of the monolithic substrate being greater than the length of the monolithic substrate;
    a capacitor mounted on the monolithic substrate, the capacitor having a first electrode layer, a second electrode layer, and a dielectric separating the first electrode layer and the second electrode layer;
    a resistor mounted on the monolithic substrate, the resistor connected in parallel with the capacitor;
    a first terminal disposed at the first end of monolithic substrate and electrically connected to the first electrode layer of the capacitor; and
    a second terminal disposed at the second end of monolithic substrate electrically connected to the second electrode layer of the capacitor.

2. The parallel RC circuit equalizer of claim 1, wherein a resonance point of the parallel RC circuit equalizer is greater than 3,000 MHz.

3. The parallel RC circuit equalizer of claim 1, wherein:
    the monolithic substrate has a top surface; and
    the first electrode layer and second electrode layer of the capacitor are mounted on the top surface of the substrate.

4. The parallel RC circuit equalizer of claim 1, wherein:
    the monolithic substrate has a top surface; and
    the resistor is supported on the top surface of the substrate.

5. The parallel RC circuit equalizer of claim 1, wherein the equalizer is surface mountable by direct mounting of the first and second terminations on a supporting surface.

6. The parallel RC circuit equalizer of claim 1, wherein at least one of the first termination or second termination comprises a flexible polymer material.

7. The parallel RC circuit equalizer of claim 1, wherein the capacitor comprises at least one of silicon oxynitride (SiON) or tantalum.

8. The parallel RC circuit equalizer of claim 1, wherein the resistor comprises at least one of tantalum nitride (TaN) or ruthenium oxide.

9. The parallel RC circuit equalizer of claim 1, wherein the equalizer has an impedance of about 50 Ω.

10. The parallel RC circuit equalizer of claim 1, further comprising:
    a first terminal layer connected to each of the first terminal and the first electrode layer of the capacitor; and
    a second terminal layer connected to each of the second terminal and the second electrode layer of the capacitor;
    wherein:
        the monolithic substrate has a top surface, and the top surface has a pair of opposing lateral edges along the top surface;
        the first terminal layer is positioned on the top surface of the substrate and along at least a portion of one of the pair of lateral edges of the top surface; and
        the second terminal layer is positioned on the top surface of the substrate and along at least a portion of the other of the pair of lateral edges that is opposite the first terminal layer.

11. The parallel RC circuit equalizer of claim 10, further comprising a third terminal layer connected to the resistor, the third terminal layer positioned on the top surface of the substrate and along at least a portion of one of the pair of lateral edges of the top surface.

12. A parallel RC circuit equalizer comprising:
    a monolithic substrate that is elongated in a longitudinal direction between a pair of longitudinal ends;
    an RC structure attached to the substrate, the RC structure comprising a capacitor and a resistor connected in parallel with the capacitor;
    a pair of respective waveguide elements attached to the substrate and electrically connected to the RC structure, each of the pair of respective waveguide elements extending from the RC structure to a respective one of the pair of longitudinal ends of the substrate:
    at least one ground electrode attached to the substrate and extending in the longitudinal direction.

13. The parallel RC circuit equalizer of claim 12, wherein the substrate has a top surface and the RC structure is mounted on the top surface of the substrate.

14. The parallel RC circuit equalizer of claim 12, wherein the pair of respective waveguide elements extend along a centerline of the top surface of the substrate, and wherein the centerline extends in the longitudinal direction.

15. The parallel RC circuit equalizer of claim 12, wherein the parallel RC circuit equalizer is surface mountable by direct mounting of the terminations on a supporting surface.

16. The parallel RC circuit equalizer of claim 12, wherein the capacitor of the RC structure comprises silicon oxynitride (SiON).

17. The parallel RC circuit equalizer of claim 12, wherein the capacitor of the RC structure comprises tantalum.

18. The parallel RC circuit equalizer of claim 12, wherein the resistor of the RC structure comprises tantalum nitride (TaN).

19. The parallel RC circuit equalizer of claim 12, wherein the resistor of the RC structure comprises ruthenium oxide.

20. The parallel RC circuit equalizer of claim 12, wherein the equalizer has an impedance of about 50 Ω.

21. The parallel RC circuit equalizer of claim 12, further comprising a ground termination electrically connected with the at least one ground electrode.

22. The parallel RC circuit equalizer of claim 21, wherein:
the monolithic substrate has a top surface and a pair of opposing lateral edges along the top surface that extend between the pair of longitudinal ends of the substrate;
the at least one ground electrode has a side edge that extends along one of the pair of opposing lateral edges of the substrate; and
the at least one ground electrode is electrically connected with the ground termination along at least a portion of the side edge of the at least one ground electrode.

23. The parallel RC circuit equalizer of claim 21, wherein the ground termination is received at least a portion of the substrate.

24. The parallel RC circuit equalizer of claim 21, wherein the ground termination is disposed centrally between the pair of longitudinal ends of the substrate.

25. The parallel RC circuit equalizer of claim 12, further including a pair of end terminations disposed on respective longitudinal ends of the substrate, and each of the pair of end terminations is connected with a respective one of the pair of waveguide elements.

26. The parallel RC circuit equalizer of claim 25, wherein the pair of end terminations comprise flexible terminations.

27. The parallel RC circuit equalizer of claim 25, wherein the pair of end terminations comprise a flexible polymer material.

28. A parallel RC circuit equalizer, comprising:
a monolithic substrate that is elongated in a longitudinal direction between a pair of longitudinal ends;
a capacitor supported on the substrate, the capacitor having a first electrode layer, a second electrode layer, and a dielectric layer between the first and second electrode layers;
a resistor supported on the substrate and electrically connected in parallel with the capacitor;
a first terminal disposed along one of the pair of longitudinal ends;
a second terminal disposed along the other of the pair of longitudinal ends;
a first waveguide element attached to the substrate and electrically connected to the first electrode layer of the capacitor, the first waveguide element extending generally in the longitudinal direction from the capacitor to one of the pair of longitudinal ends of the substrate and electrically connected with the first terminal;
a second waveguide element attached to the substrate and electrically connected to each of the resistor and the second electrode layer of the capacitor, the second waveguide element extending generally in the longitudinal direction from the resistor to the other of the pair of longitudinal ends of the substrate and electrically connected with the second terminal;
a ground terminal attached to the substrate; and
at least one ground electrode attached to the substrate and extending in the longitudinal direction, the at least one ground electrode electrically connected to the ground terminal.

* * * * *